United States Patent
Kawai et al.

(10) Patent No.: US 11,569,241 B2
(45) Date of Patent: Jan. 31, 2023

(54) SEMICONDUCTOR DEVICE

(71) Applicant: Kioxia Corporation, Tokyo (JP)

(72) Inventors: Hiroki Kawai, Inazawa Aichi (JP);
Junji Kataoka, Kawasaki Kanagawa (JP); Keiji Ikeda, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 50 days.

(21) Appl. No.: 17/193,941

(22) Filed: Mar. 5, 2021

(65) Prior Publication Data

US 2022/0068925 A1 Mar. 3, 2022

(30) Foreign Application Priority Data

Aug. 26, 2020 (JP) .............................. JP2020-142583

(51) Int. Cl.
| | |
|---|---|
| *H01L 27/108* | (2006.01) |
| *H01L 29/24* | (2006.01) |
| *H01L 29/66* | (2006.01) |
| *H01L 29/786* | (2006.01) |
| *H01L 21/02* | (2006.01) |

(52) U.S. Cl.
CPC .... *H01L 27/1082* (2013.01); *H01L 21/02565* (2013.01); *H01L 21/02592* (2013.01); *H01L 27/10873* (2013.01); *H01L 29/247* (2013.01); *H01L 29/66969* (2013.01); *H01L 29/78642* (2013.01); *H01L 29/78693* (2013.01)

(58) Field of Classification Search
CPC ......... H01L 21/02483; H01L 21/02565; H01L 21/02592; H01L 29/247; H01L 29/78693
See application file for complete search history.

(56) References Cited

U.S. PATENT DOCUMENTS

| | | | |
|---|---|---|---|
| 8,624,237 B2 | 1/2014 | Yamazaki | |
| 9,496,404 B2 | 11/2016 | Yamazaki | |
| 9,553,200 B2 | 1/2017 | Isobe | |
| 2014/0138683 A1 | 5/2014 | Yamazaki | |

(Continued)

FOREIGN PATENT DOCUMENTS

| | | |
|---|---|---|
| JP | 6499246 B2 | 4/2019 |
| JP | 6595657 B2 | 10/2019 |

(Continued)

OTHER PUBLICATIONS

Um et al., "Heavily doped n-type a-IGZO by F plasma treatment and its thermal stability up to 600° C.", Applied Physics Letters 112, 162104 (2018), 5 pages.

(Continued)

*Primary Examiner* — Raj R Gupta
(74) *Attorney, Agent, or Firm* — Foley & Lardner LLP

(57) ABSTRACT

A semiconductor device of an embodiment includes an oxide semiconductor layer. The oxide semiconductor layer includes a metal oxide containing at least one first metal element selected from the group consisting of indium and tin and at least one second metal element selected from the group consisting of zinc, gallium, aluminum, tungsten, and silicon. The oxide semiconductor layer includes a first region in which at least one anion element selected from the group consisting of fluorine and chlorine is contained within a range of 1 atomic % or more and less than 8 atomic % in the metal oxide.

6 Claims, 16 Drawing Sheets

(56) References Cited

U.S. PATENT DOCUMENTS

2015/0279913 A1 10/2015 Gates
2016/0343878 A1* 11/2016 Kwon ............... H01L 21/02584
2019/0157461 A1 5/2019 Yamazaki

FOREIGN PATENT DOCUMENTS

JP       2020-057798 A    4/2020
JP       2020-057806 A    4/2020

OTHER PUBLICATIONS

Nahm et al., "Undercoordinated indium as an intrinsic electron-trap center in amorphous InGaZnO$_4$", NPG Asia Materials 6, e143 (2014), 5 pages.

* cited by examiner

FIG. 1
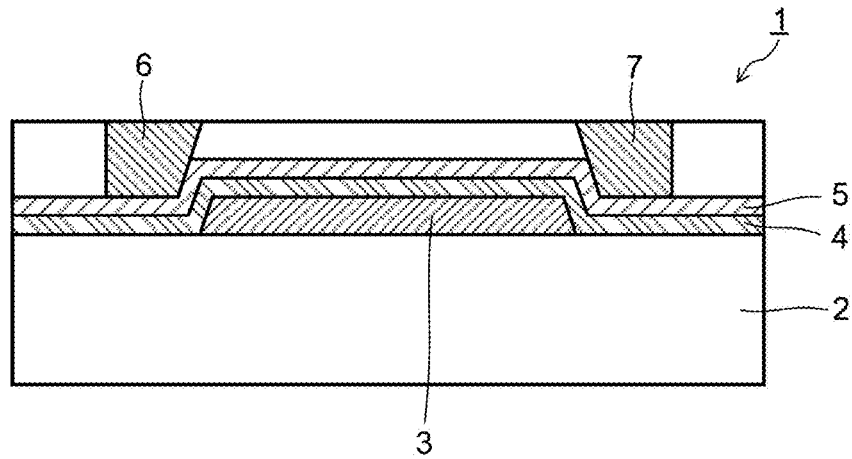
FIG. 2
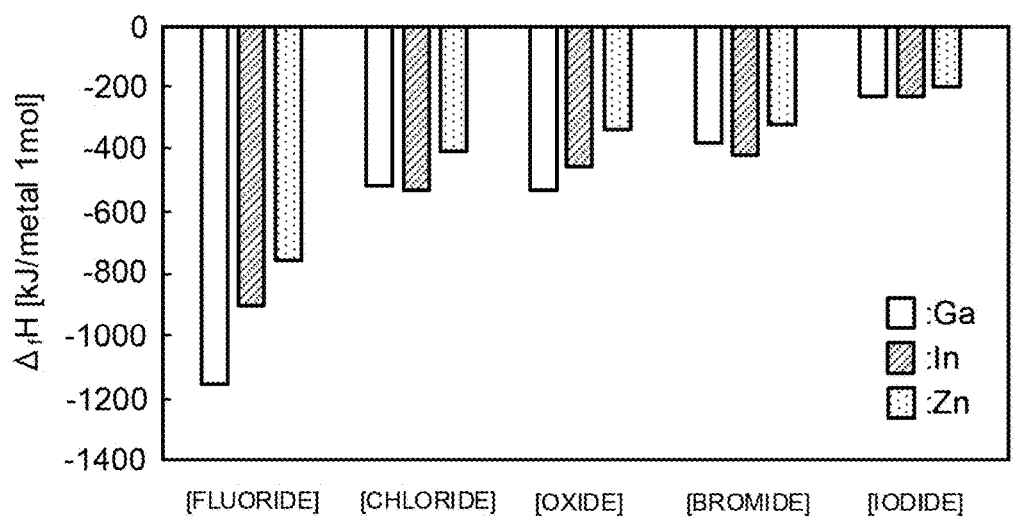
FIG. 3
| HAFL REACTION FORMULA | STANDARD ELECTRODE POTENTIAL (V vs SHE) |
|---|---|
| $F_2(g) + 2e^- \rightleftharpoons 2F^-$ | +2.87 |
| $Cl_2(g) + 2e^- \rightleftharpoons 2Cl^-$ | +1.36 |
| $O_2(g) + 4H^+ + 4e^- \rightleftharpoons 2H_2O$ | +1.23 |
| $Br_2(l) + 2e^- \rightleftharpoons 2Br^-$ | +1.07 |
| $I_2(s) + 2e^- \rightleftharpoons 2I^-$ | +0.54 |

SEMICONDUCTOR DEVICE

CROSS REFERENCE TO RELATED APPLICATIONS

This application is based upon and claims the benefit of priority from Japanese Patent Application No. 2020-142583, filed on Aug. 26, 2020; the entire contents of which are incorporated herein by reference.

FIELD

Embodiments disclosed herein relate to a semiconductor device.

BACKGROUND

An oxide semiconductor transistor using an oxide semiconductor in a channel region has a characteristic of a small channel leakage current. In such an oxide semiconductor transistor, a metal oxide containing one kind or two kinds or more of metal elements such as indium (In), tin (Sn), zinc (Zn), and gallium (Ga) is used, for instance. Such a metal oxide having, for example, an amorphous structure has characteristics of a large band gap and high mobility but may have poor characteristics as a semiconductor.

BRIEF DESCRIPTION OF THE DRAWINGS

FIG. 1 is a sectional view illustrating a semiconductor device of a first embodiment.

FIG. 2 is a chart illustrating enthalpies of formation of halides and oxides of representative examples P of metal elements in an oxide semiconductor layer of the semiconductor device of the embodiment.

FIG. 3 is a table showing standard electrode potentials of anion elements contained in the oxide semiconductor layer of the semiconductor device of the embodiment and of oxygen.

DETAILED DESCRIPTION

Figure 4A:
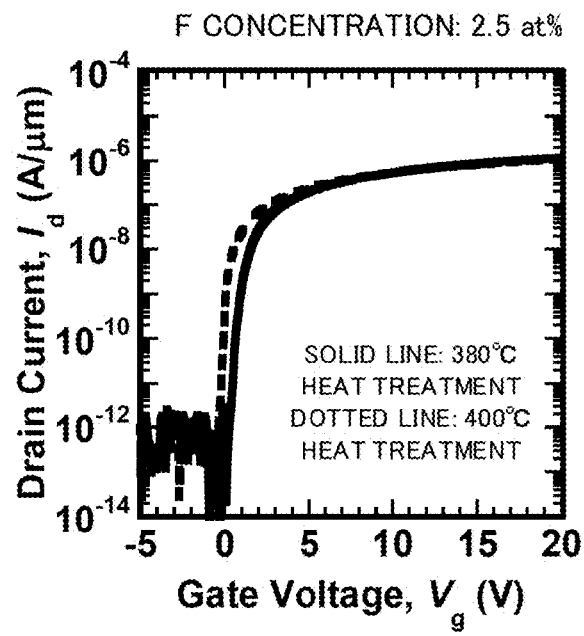
FIG. 4A and FIG. 4B are charts each illustrating relations between gate voltage (Vg) and drain current (Id) of the semiconductor device of the first embodiment after it undergoes heat treatments.

A semiconductor device of an embodiment includes an oxide semiconductor layer. The oxide semiconductor layer includes a metal oxide containing at least one first metal element selected from the group consisting of indium and tin and at least one second metal element selected from the group consisting of zinc, gallium, aluminum, tungsten, and silicon. The oxide semiconductor layer includes a first region in which at least one anion element selected from the group consisting of fluorine and chlorine is contained within a range of 1 atomic % or more and less than 8 atomic % in the metal oxide.

Semiconductor devices of embodiments will be hereinafter described with reference to the drawings. In the embodiments, substantially the same constituent parts are denoted by the same reference signs and a description thereof may be partly omitted. The drawings are schematic, and a relation of thickness and planar dimension, thickness ratios among parts, and so on may be different from actual ones.

First Embodiment

FIG. 1 illustrates a thin film transistor (TFT) 1 as a semiconductor device of a first embodiment. The thin film transistor 1 is a bottom-gate oxide semiconductor transistor having an oxide semiconductor layer as a channel layer serving as a channel formation region. The transistor 1 illustrated in FIG. 1 includes a substrate 2, a gate electrode 3 as a first electrode, a gate insulation film 4, an oxide semiconductor layer 5 as a channel layer, a source electrode 6 as a second electrode, and a drain electrode 7 as a third electrode. The semiconductor device of the embodiment is not limited to the transistor having the oxide semiconductor layer as the channel layer and can be applied to a semiconductor device including an oxide semiconductor layer having any of various functions.

In the semiconductor device 1 illustrated in FIG. 1, the gate electrode 3 extends on the substrate 2 such as a semiconductor substrate in a first direction which is a planar direction of the substrate 2. The gate insulation film 4 is on the substrate 2 to cover the gate electrode 3. The oxide semiconductor layer 5 as the channel layer is provided above the gate electrode 3 with the gate insulation film 4 therebetween to extend in the first direction. Part of the oxide semiconductor layer 5 faces (for example, is stacked above) the gate electrode 3 with the gate insulation film 4 therebetween. On one end (first end portion) of the oxide semiconductor layer 5 in terms of the first direction, the source electrode 6 is provided to be electrically connected thereto, and on the other end (second end portion) in terms of the first direction, the drain electrode 7 is provided to be electrically connected thereto.

The gate electrode 3 contains a metal, a metal compound, a conductive oxide, a semiconductor, or the like. The gate electrode 3 can contain, for example, at least one element selected from tungsten (W), molybdenum (Mo), copper (Cu), tantalum (Ta), aluminum (Al), and the like. The gate electrode 3 may contain an aluminum alloy whose main component is aluminum. The gate electrode 3 may contain titanium nitride (TiN), tantalum nitride (TaN), or the like. The gate insulation film 4 contains silicon oxide (SiO), silicon nitride (SiN), or the like. The source electrode 6 and the drain electrode 7 are made of the same material as that of the gate electrode 3.

The oxide semiconductor layer 5 includes a metal oxide containing at least one first metal element (hereinafter, sometimes referred to as the M1 element) selected from a group consisting of indium (In) and tin (Sn) and at least one second metal element (hereinafter, sometimes referred to as the M2 element) selected from a group consisting of zinc (Zn), gallium (Ga), aluminum (Al), tungsten (W), and silicon (Si). Examples of the metal oxide included in the oxide semiconductor layer 5 include a metal oxide (M1-M2-O) in which one oxide selected from a group consisting of an In oxide, an Sn oxide, and an InSn oxide contains at least one second metal element (M2 element) selected from a group consisting of Zn, Ga, Al, W, and Si.

Specific examples of the In oxide containing the M2 element include InZnGaAlWSiO, InGaAlWSiO, InZnAlWSiO, InZnGaWSiO, InZnGaAlWO, InZnGaAlSiO, InAlWSiO, InGaWSiO, InGaAlWO, InGaAlSiO, InZnWSiO, InZnAlWO, InZnAlSiO, InZnGaWO, InZnGaSiO, InZnGaAlO, InWSiO, InAlWO, InAlSiO, InGaWO, InGaSiO, InGaAlO, InZnWO, InZnSiO, InZnAlO, InZnGaO, InZnO, InGaO, InAlO, InSiO, and InWO.

Specific examples of the Sn oxide containing the M2 element include SnZnGaAlWSiO, SnZnGaAlWSiO, SnGaAlWSiO, SnZnAlWSiO, SnZnGaWSiO, SnZnGaAlWO, SnZnGaAlSiO, SnAlWSiO, SnGaWSiO, SnGaAlWO, SnGaAlSiO, SnZnWSiO, SnZnAlWO, SnZnAlSiO, SnZnGaWO, SnZnGaSiO, SnZnGaAlO, SnWSiO, SnAlWO, SnAlSiO, SnGaWO, SnGaSiO, SnGaAlO, SnZnWO, SnZnSiO, SnZnAlO, SnZnGaO, SnZnO, SnGaO, SnAlO, SnSiO, and SnWO.

Examples of the InSn oxide containing the M2 element include InSnZnGaAlWSiO, InSnZnGaAlWSiO, InSnGaAlWSiO, InSnZnAlWSiO, InSnZnGaWSiO, InSnZnGaAlWO, InSnZnGaAlSiO, InSnAlWSiO, InSnGaWSiO, InSnGaAlWO, InSnGaAlSiO, InSnZnWSiO, InSnZnAlWO, InSnZnAlSiO, InSnZnGaWO, InSnZnGaSiO, InSnZnGaAlO, InSnWSiO, InSnAlWO, InSnAlSiO, InSnGaWO, InSnGaSiO, InSnGaAlO, InSnZnWO, InSnZnSiO, InSnZnAlO, InSnZnGaO, InSnZnO, InSnGaO, InSnAlO, InSnSiO, and InSnWO.

The one metal oxide (M1 oxide) selected from the group consisting of the In oxide, the Sn oxide, and the InSn oxide is known as a high-mobility oxide semiconductor. These metal oxides preferably have an amorphous structure. The oxide semiconductor layer 5 can have characteristics with less variation by including the metal oxide having the amorphous structure. In the semiconductor device 1 of the embodiment, at least one M2 element selected from the group consisting of Zn, Ga, Al, W, and Si is contained in the aforesaid metal oxide (M1 oxide) to enhance the characteristics of the M1 oxide. In the semiconductor device 1 of the embodiment, such a metal oxide (M1-M2-O) is used in the oxide semiconductor layer 5.

Among the M2 elements listed above, Zn has an effect of promoting amorphous stability. Ga, Al, W, Si, and so on contribute to improvement in thermal stability of the M1 oxide because of their strong bonding strength with oxygen. Concerning the thermal stability of the M1 oxide, it is required to reduce the metallization of the M1 oxide due to its reduction caused by heat treatment or the like in a manufacturing process of the semiconductor device 1. A content ratio of the M1 element and the M2 element in M1-M2-O can be appropriately selected according to characteristics required of the oxide semiconductor layer 5. For example, the content of the M1 element in M1-M2-O can be not less than 10 atomic % nor more than 40 atomic %, and the content of the M2 element can be not less than 1 atomic % nor more than 30 atomic %.

However, only the addition of Ga, Al, W, and/or Si to the M1 oxide cannot sufficiently increase the thermal stability of the M1 oxide. The same applies to the oxide in which Zn is added to the M1 oxide. Therefore, in the semiconductor device 1 of the embodiment, the metal oxide (M1-M2-O) containing the first metal element (M1 element) and the second metal element (M2 element) contains at least one anion element (hereinafter, sometimes called the A element) selected from a group consisting of fluorine (F) and chlorine (Cl). The anion element (A element) may be contained in the entire oxide semiconductor layer 5 including M1-M2-O, or may be contained only in a partial region of the oxide semiconductor layer 5 as will be described later. What is needed is that the oxide semiconductor layer 5 has a region in which the M1-M2-O contains the A element.

Fluorine (F) and chlorine (Cl) are stronger in bonding strength with the M1 element and the M2 element which are cations than oxygen (O). That is, anions of F and Cl strongly bond with the cations of M1 and M2 and thus can increase the thermal stability of M1-M2-O. As an index of the bonding strength of F and Cl which are halogen elements with the cations, FIG. 2 illustrates enthalpies of formation ($\Delta_f H$) of fluorides (F-ide) and chlorides (Cl-ide) of Ga, In, and Zn as representative examples of the M1 element and the M2 element, and also illustrates, as a comparison, enthalpies of formation ($\Delta_f H$) of oxides of Ga, In, and Zn. Regarding bromine (Br) and iodine (I) which are halogen elements as reference elements, FIG. 2 also illustrates enthalpies of formation ($\Delta_f H$) of bromides (Br-ide) and iodides (I-ide).

As illustrated in FIG. 2, absolute values of the enthalpies of formation of the fluorides and the chlorides of Ga, In, and Zn are larger than those of the oxides of Ga, In, and Zn. From this, it is seen that the fluorides of Ga, In, and Zn are more stable than the oxides of Ga, In, and Zn. Therefore, by an appropriate amount of the A element (F, Cl) being contained in M1-M2-O forming the oxide semiconductor layer 5, it is possible to improve the thermal stability of the oxide semiconductor layer 5 to reduce the metallization due to the reduction by the heat treatment. In this respect, absolute values of the enthalpies of formation of the bromides (Br-ide) and the iodides (I-ide) of Ga, In, and Zn are smaller than those of the oxides of Ga, In, and Zn. Therefore, even if containing Br and I as the halogen elements, the oxide semiconductor layer 5 cannot have improved thermal stability.

Regarding the aforesaid halogen elements F, Cl, Br, and I, from a viewpoint of a standard electrode potential serving as an index of oxidizing power, it is expected that metal compounds of F and Cl are stable, while metal compounds of Br and I are unstable. FIG. 3 shows half reaction formulas of F, Cl, O, Br, and I and standard electrode potentials (V vs SHE) based on these. As shown in FIG. 3, the standard electrode potentials of F and Cl are larger than that of O, while the standard electrode potentials of Br and I are smaller than that of O. The standard electrode potentials are large in order of F>Cl>O>Br>I, indicating that F and Cl are strong in oxidizing power, while Br and I are weak in oxidizing power. From this, it is seen that the metal compounds of F and Cl are stable and can improve the thermal stability of the oxide semiconductor layer 5. On the other hand, it is seen that the metal compounds of Br and I are unstable and do not contribute to the improvement in the thermal stability of the oxide semiconductor layer 5.

The content of F and Cl in the aforesaid M1-M2-O is preferably set within an appropriate range. Specifically, if the content of F and Cl in M1-M2-O is too low, it is not possible to sufficiently obtain the effect of improving the thermal stability brought about by F and Cl. On the other hand, if the content of F and Cl in M1-M2-O is too high, a metal-metal bond which becomes an electron trap is readily formed to readily deactivate carrier electrons. This tends to lower the mobility of the oxide semiconductor to decrease an on-current. That is, the characteristics of the oxide semiconductor degrade. In consideration of these points, the content of at least one A element out of F and Cl in M1-M2-O is preferably within a range of 1 atomic % or more and less than 8 atomic %, and more preferably within a range of less than 7 atomic %. The oxide semiconductor containing the A element within such a range can have higher thermal stability while maintaining high mobility.

Figure 4B:
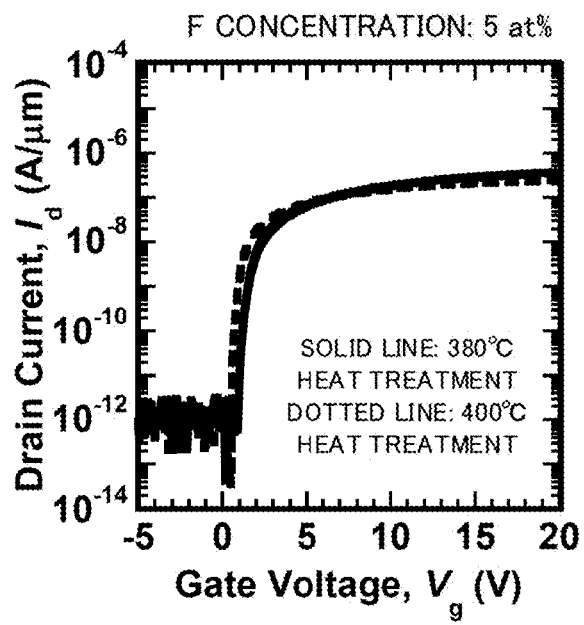
Figure 5A:
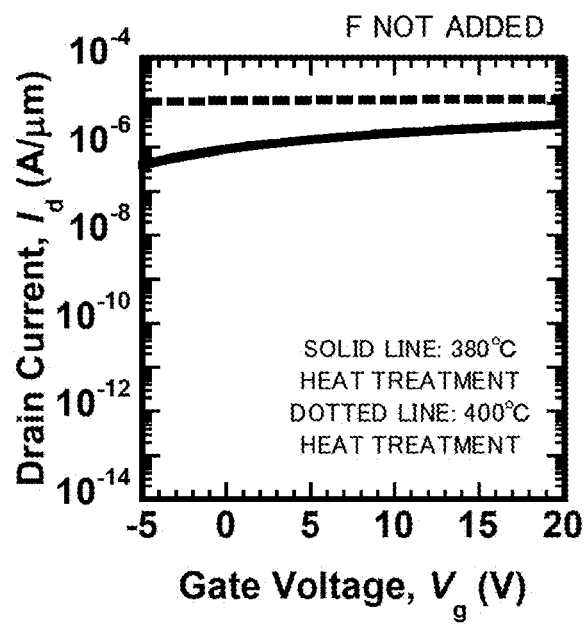
FIG. 5A to FIG. 5C are charts each illustrating relations between gate voltage (Vg) and drain current (Id) of a semiconductor device of a comparative example after it undergoes heat treatments.
Figure 5B:
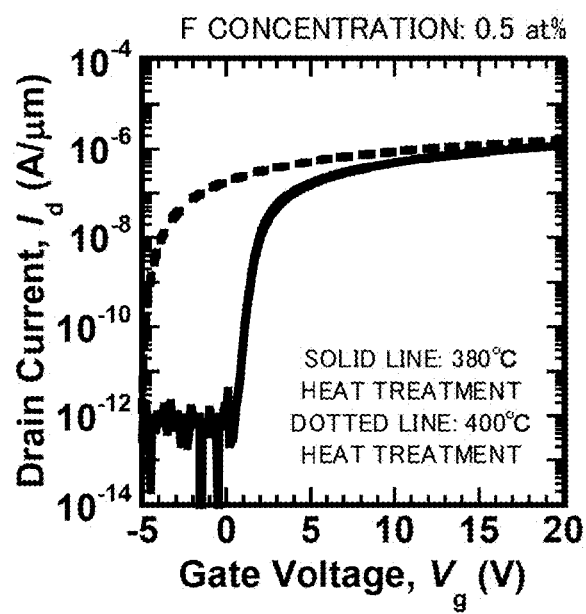
Figure 5C:
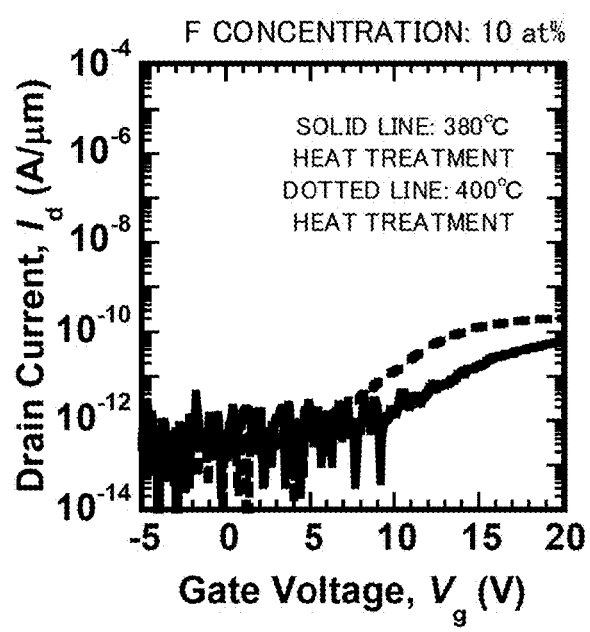

In the context of the above points, FIG. 4A, FIG. 4B, FIG. 5A, FIG. 5B, and FIG. 5C illustrate the results of studying relations of drain current (Id) vs. gate voltage (Vg) (Vg-Id characteristics) of the bottom-gate oxide semiconductor transistor (TFT) illustrated in FIG. 1. FIG. 4A and FIG. 4B each illustrate the Vg-Id characteristics of TFT1 after annealing at 380° C. in a forming gas and at 400° C. in a forming gas, in the cases where the oxide semiconductor layer 5 of TFT1 includes an amorphous oxide whose base oxide is InGaZnO and contains 2.5 atomic % F (FIG. 4A) and 5 atomic % F (FIG. 4B). FIG. 5A, FIG. 5B, and FIG. 5C each illustrate the Vg-Id characteristics of TFT1 after annealing at 380° C. in a forming gas and at 400° C. in a forming gas, in the cases where the oxide semiconductor layer 5 of TFT1 includes an amorphous oxide whose base oxide is InGaZnO and contains no F (FIG. 5A), 0.5 atomic % F (FIG. 5B), and 10 atomic % F (FIG. 5C).

As illustrated in FIG. 4A and FIG. 4B, the Vg-Id characteristics of TFT1 after annealed at 400° C. and after annealed at 380° C. are similar both in the case where its oxide semiconductor layer 5 includes the amorphous oxide containing 2.5 atomic % F (FIG. 4A) and in the case where the oxide semiconductor layer 5 includes the amorphous oxide containing 5 atomic % F (FIG. 4B). That is, an on-current of TFT1 is maintained even after the 400° C. annealing. Therefore, if the F concentration is 2.5 atomic % or 5 atomic %, it is possible to improve the thermal stability while maintaining the high mobility of the oxide semiconductor layer 5. As illustrated in FIG. 5C, it is confirmed that the on-current of TFT1 decreases, and the mobility of the oxide semiconductor layer 5 decreases when the F concentration is 10 atomic % or more. F and Cl replacing O work as donor impurities, and one carrier electron is generated at the replacement of one atom. The metal-metal bond is easily generated when the carrier electron concentration is 4.7× $10^{21}$ cm$^{-3}$ or more, and at this time, it is expected that the atomic concentration of F and Cl is about 7 atomic %. Therefore, when the F concentration is in a range of less than 8 atomic %, the same effect as that obtained when the F concentration is 5 atomic % is expected.

On the other hand, TFT1 whose oxide semiconductor layer 5 includes the amorphous oxide containing 0.5 atomic % F does not exhibit an ON-OFF characteristic after annealed at 400° C., though exhibiting the good Vg-Id characteristic after annealed at 380° C. A possible reason for this is that the oxide semiconductor layer 5 is reduced by the heat treatment to be metalized and loses semiconductor characteristics. As a solution to this, it is expected that using the oxide semiconductor layer 5 whose F concentration is 1 atomic % can bring about the same effect as that of the oxide semiconductor layer 5 whose F concentration is 2.5 atomic %. These effects can also be obtained when M1-M2-O contains Cl instead of F because of the similarity of the characteristics of the aforesaid F and Cl. Therefore, the content of the A element in M1-M2-O forming the oxide semiconductor layer 5 is preferably 1 atomic % or more and less than 8 atomic %. Note that, when the two elements F and Cl are used as the A element, the composition is preferably adjusted such that the total amount of these falls within the range of 1 atomic % or more and less than 8 atomic %.

The metal oxide resulting from the replacement of part of O of the metal oxide (M1-M2-O) containing the M1 element and the M2 element with the A element preferably satisfies the following composition. Specifically, let M1-M2-O in which part of O is replaced with the A element be represented by

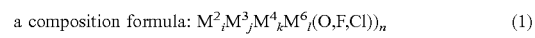

a composition formula: $M^2_i M^3_j M^4_k M^6_l (O,F,Cl))_n$     (1)

where $M^2$ represents Zn, $M^3$ represents at least one of In, Ga, or Al, $M^4$ represents at least one of Sn or Si, and $M^6$ represents W, i represents an atomic ratio of $M^2$, j represents an atomic ratio of $M^3$, k represents an atomic ratio of $M^4$, l represents an atomic ratio of $M^6$, and n represents an atomic ratio of (O, F, Cl), and (O, F, Cl) represents at least one of O, F, or Cl.

M1-M2-O in which part of O is replaced with the A element preferably has a composition satisfying the following relation.

$(2i+3j+4k+6l)/2\times 0.95 < n < (2i+3j+4k+6l)/2\times 1.05$     (2)

Consequently, it is possible to stably obtain the characteristics as the oxide semiconductor. Here, O, F, and Cl are anions, and though O has −2 valence and F and Cl have −1 valence, F and Cl are considered as having −2 valence in the calculation assuming that the part of O is replaced with F and Cl.

As described above, according to TFT1 that includes the oxide semiconductor layer 5 including M1-M2-O containing the A element within the range of 1 atomic % or more and less than 8 atomic %, it is possible to enhance thermal stability against heat treatment executed in the manufacturing process, for example, thermal stability against 400° heat treatment executed in a typical semiconductor device manufacturing process while maintaining high mobility that M1-M2-O originally has, a high on-current based on the high mobility, and a low leakage current. Therefore, it is possible to enhance the thermal stability while maintaining the on-current based on the high mobility and obtaining the low leakage current. These make it possible to provide a semiconductor device such as the oxide semiconductor transistor 1 having improved characteristics, and stability and reproducibility thereof.

Figure 6:
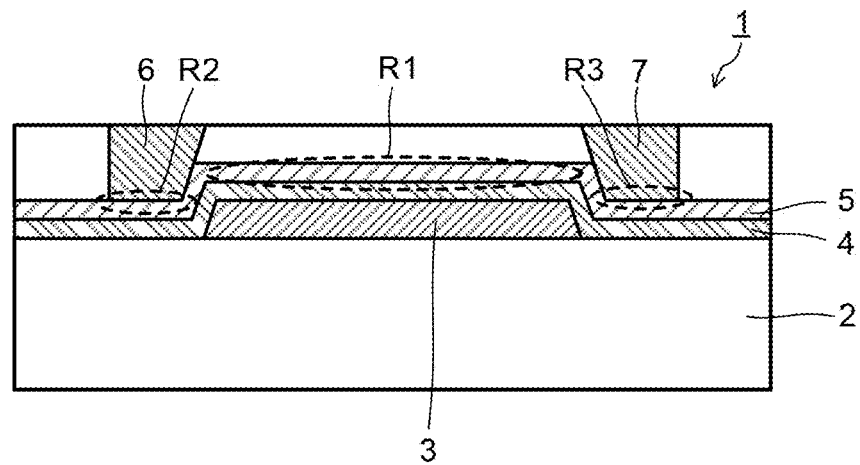
FIG. 6 is a sectional view illustrating a modification example of the semiconductor device of the first embodiment.

In the oxide semiconductor transistor 1 of the first embodiment, the thermal stability and the resulting metallization inhibiting effect required for the oxide semiconductor layer 5 may differ depending on each part of the oxide semiconductor layer 5. For example, as illustrated in FIG. 6, in the oxide semiconductor layer 5, a first region R1 immediately above the gate electrode 3 is a region that is directly expected to function as the channel region and thus is required to less undergo the metallization due to the heat treatment to function as a high-mobility semiconductor. On the other hand, in the oxide semiconductor layer 5, a second region R2 in contact with the source electrode 6 and a third region R3 in contact with the drain electrode 7 may be required to have low contact resistances (Schottky resistances) with the source electrode 6 and the drain electrode 7 to have high electrical connection characteristics with the source electrode 6 and the drain electrode 7.

As described above, the characteristics required of the oxide semiconductor layer 5 may differ depending on each region (for example, the region R1, the region R2, or the region R3). Considering this, the first region R1 immediately above the gate electrode 3 in the oxide semiconductor layer 5 is preferably formed of M1-M2-O containing the A element, in particular, M1-M2-O containing the A element within the range of 1 atomic % or more and less than 8 atomic %. On the other hand, in the region R2 in contact with the source electrode 6 and the third region R3 in contact with the drain electrode 7 in the oxide semiconductor layer 5, the metallization due to the heat treatment is preferably promoted to decrease the contact resistances with the source electrode 6 and the drain electrode 7. Therefore, the second region R2 and the third region R3 are preferably formed of M1-M2-O not containing the A element, or M1-M2-O in which the content of the A element is less than 1 atomic %. As a result, in the second region R2 and the third region R3 of the oxide semiconductor layer 5, the metallization due to the heat treatment is promoted, making it possible to decrease the contact resistances with the source electrode 6 and the drain electrode 7. As a result of these, it is possible to provide a semiconductor device such as the oxide semiconductor transistor 1 having enhanced characteristics.

Second Embodiment

Figure 7:
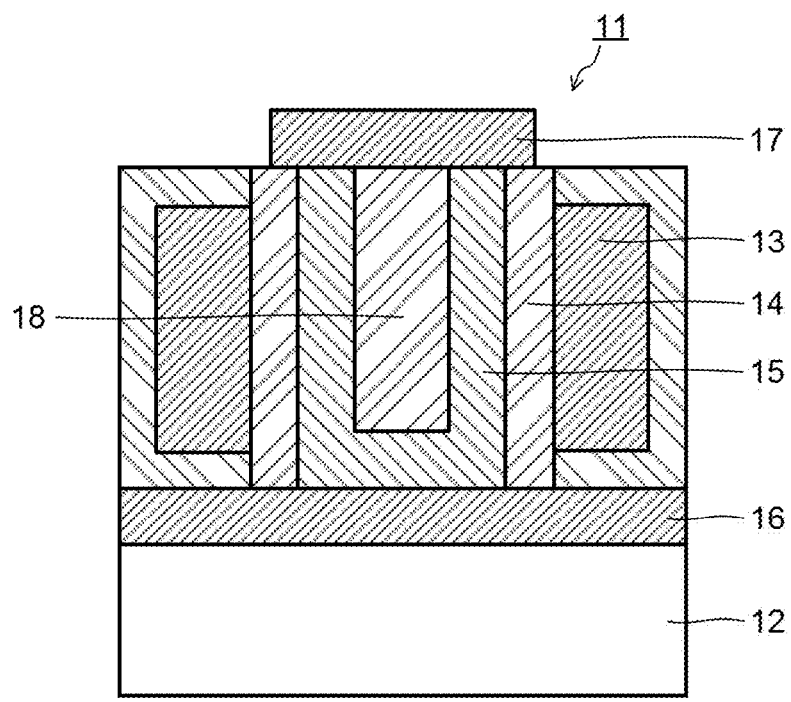
FIG. 7 is a sectional view illustrating a semiconductor device of a second embodiment.

FIG. 7 illustrates a transistor 11 as a semiconductor device of a second embodiment. The transistor 11 is a vertical transistor and is what is called a surrounding gate transistor (SGT) in which a gate electrode surrounds a channel layer. The transistor 11 illustrated in FIG. 7 includes a substrate 12, a gate electrode 13 as a first electrode, a gate insulation film 14, an oxide semiconductor layer 15 as a channel layer, a source electrode 16 as a second electrode, and a drain electrode 17 as a third electrode.

In the transistor 11 illustrated in FIG. 7, the source electrode 16 is on the substrate 12 such as a semiconductor substrate. On the source electrode 16, the oxide semiconductor layer 15 extends in a first direction intersecting with a surface of the substrate 12. The oxide semiconductor layer 15 has a cylindrical shape having a bottom portion, and the bottom portion of the cylinder forming the oxide semiconductor layer 15 is in contact with the source electrode 16. The bottom portion of the cylinder in the oxide semiconductor layer 15 is a portion electrically connected to the source electrode 16. The insulation film 14 is provided along the outer peripheral surface of the cylindrical oxide semiconductor layer 15. The gate electrode 13 is provided along the outer peripheral surface of the cylindrical oxide semiconductor layer 15 with the insulation film 14 therebetween. The drain electrode 17 is electrically connected to an end portion, of the cylindrical oxide semiconductor layer 15, opposite the bottom portion.

The gate electrode 13, the source electrode 16, the drain electrode 17, and the insulation film 14 contain the same materials as those of the first embodiment. The inside of the cylindrical oxide semiconductor layer 15 is filled with an insulator 18 such as silicon oxide. The cylindrical oxide semiconductor layer 15 may be replaced with a columnar oxide semiconductor layer 15 whose entire portion up to its inside is formed of an oxide semiconductor. In this structure, the insulator 18 such as silicon oxide is not filled. What is needed is that the oxide semiconductor layer 15 is provided between the source electrode 16 and the drain electrode 17 to extend in the first direction, that is, in the up-down direction of the transistor 11 (the thickness direction at the time of the manufacture of the parts), and as a result, the vertical transistor is formed.

As in the first embodiment, the oxide semiconductor layer 15 in the transistor 11 of the second embodiment includes a metal oxide (M1-M2-O) containing at least one metal element (M1 element) selected from a group consisting of In and Sn and at least one second metal element (M2 element) selected from a group consisting of Zn, Ga, Al, W, and Si, and has a region (first region) in which at least one anion element (A element) selected from a group consisting of F and Cl is contained within a range of 1 atomic % or more and less than 8 atomic % in the metal oxide. The first region containing the A element may be formed in the entire oxide semiconductor layer 15 or may be formed only in part of the oxide semiconductor layer 15 as will be described in detail later.

According to the transistor 11 that uses the oxide semiconductor layer 15 including the first region formed of M1-M2-O containing the A element, it is possible to enhance thermal stability against heat treatment or the like executed in a manufacturing process, for example, thermal stability against 400° heat treatment executed in a typical semiconductor device manufacturing process while maintaining high mobility that M1-M2-O originally has, a high on-current based on the high mobility, and a low leakage current, as in the first embodiment. Therefore, it is possible to enhance the thermal stability while maintaining the on-current based on the high mobility and obtaining the low leakage current. These make it possible to provide a semiconductor device such as the oxide semiconductor transistor 11 having improved characteristics, and stability and reproducibility thereof.

The first region in the oxide semiconductor layer 15 of the second embodiment preferably contains the A element within the range of 1 atomic % or more and less than 8 atomic % as in the first embodiment. A second region and a third region other than the first region preferably contain the A element whose content is less than 1 atomic % as in the first embodiment. The metal oxide semiconductor formed of M1-M2-O containing the A element preferably has a composition satisfying the formula (2) when its composition is represented by the formula (1) as in the first embodiment. The other structure of the oxide semiconductor layer 15 is the same as that in the first embodiment. The second embodiment is the same in the constituent materials and so on of the parts as the first embodiment except in that the structure is different from that of the transistor of the first embodiment, and exhibits the same effects as those of the first embodiment.

Figure 8:
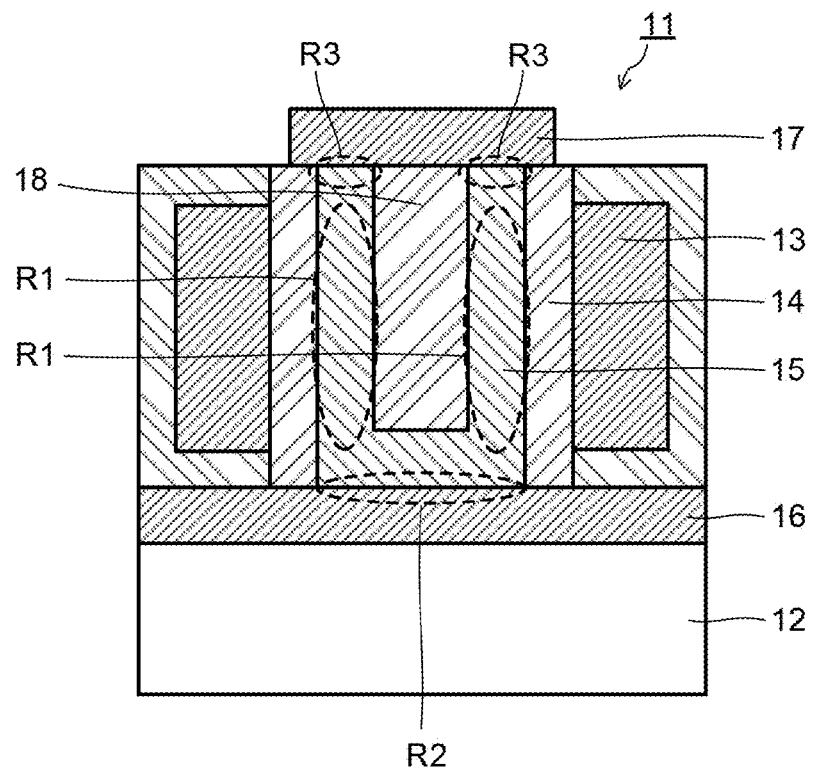
FIG. 8 is a sectional view illustrating a modification example of the semiconductor device of the second embodiment.

The transistor 11 of the second embodiment can include an oxide semiconductor layer 15 having a first region R1, a second region R2, and a third region R3 as illustrated in FIG. 8. For example, the first region R1 facing the gate electrode 13 in the oxide semiconductor layer 15 is a region that is expected to function as the channel region and thus is required to be less likely to undergo the metallization due to heat treatment and function as a high-mobility semiconductor. Therefore, the first region R1 in the oxide semiconductor layer 15 is preferably formed of M1-M2-O containing the A element, in particular, M1-M2-O containing the A element within the range of 1 atomic % or more and less than 8 atomic %.

On the other hand, the second region R2 in contact with the source electrode 16 and the third region R3 in contact with the drain electrode 17 in the oxide semiconductor layer 15 are required to be low in contact resistances (Schottky resistances) with the source electrode 6 and the drain electrode 7 to have high electrical connection characteristics with the source electrode 6 and the drain electrode 7. Therefore, in order to promote the metallization due to the heat treatment to reduce the contact resistances with the source electrode 16 and the drain electrode 17, the second and third regions R2, R3 in the oxide semiconductor layer 15 are preferably formed of M1-M2-O in which the content of the A element is less than 1 atomic %. As a result, in the second and third regions R2, R3 of the oxide semiconductor layer 15, the metallization due to the heat treatment is promoted, making it possible to decrease the contact resistances with the source electrode 16 and the drain electrode 17. As a result of these, it is possible to provide a semiconductor device such as the oxide semiconductor transistor 11 having further enhanced characteristics.

Figure 9A:
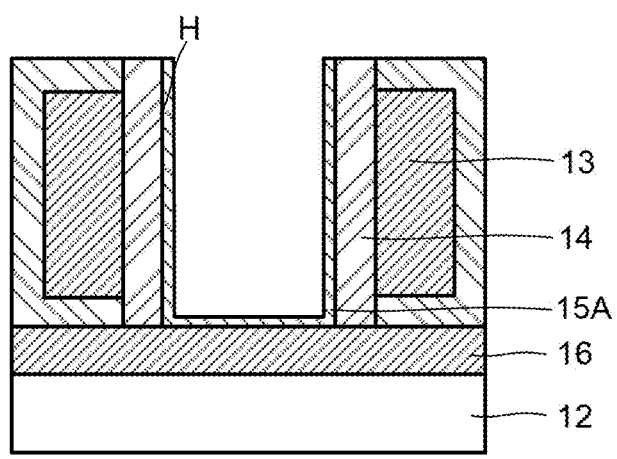
FIG. 9A to FIG. 9C are sectional views illustrating a first manufacturing process of the semiconductor device of the second embodiment.
Figure 9B:
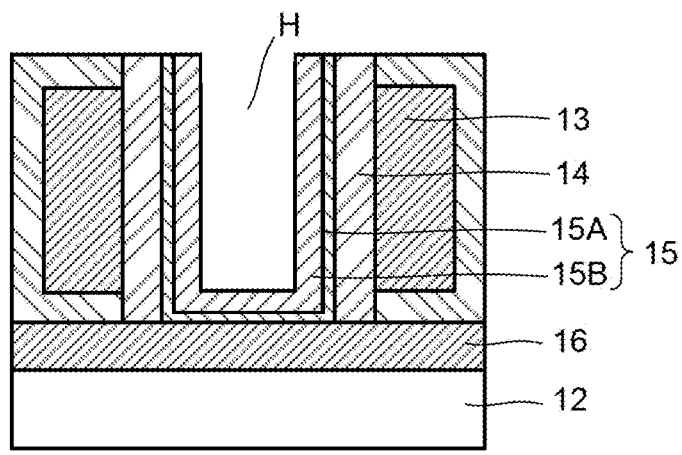
Figure 9C:
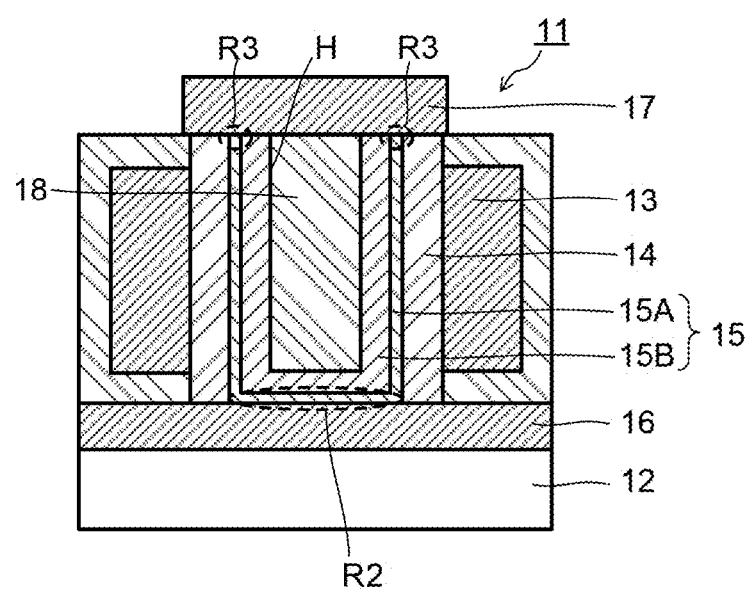

It is possible to obtain the transistor 11 illustrated in FIG. 8 by, for example, employing a first manufacturing process illustrated in FIG. 9A to FIG. 9C, a second manufacturing process illustrated in FIG. 10A to FIG. 10D, a third manufacturing process illustrated in FIG. 11A to FIG. 11D, or a fourth manufacturing process illustrated in FIG. 12A to FIG. 12D. As is shown in the following examples of these manufacturing processes, regarding the second region R2 and the third region R3 of the oxide semiconductor layer 15, a region in which the content of the A element is less than 1 atomic % may be set both in the region R2 in contact with the source electrode 16 and the region R3 in contact with the drain electrode 17 or may be set in one of the second region R2 and the third region R3. As a modification example of the transistor 11 illustrated in FIG. 8, a columnar oxide semiconductor layer 15 whose whole part up to its inside is formed of the oxide semiconductor may be used instead of the cylindrical oxide semiconductor layer 15. In this structure, the insulator 18 such as silicon oxide is not filled.

The first manufacturing process of the transistor 11 illustrated in FIG. 8 will be described with reference to FIG. 9A to FIG. 9C. The first manufacturing process illustrated in FIG. 9A to FIG. 9C is a manufacturing method that sets the region in which the content of the A element is less than 1 atomic %, both in the region R2 in contact with the source electrode 16 and the region R3 in contact with the drain electrode 17. First, as illustrated in FIG. 9A, the source electrode 16, the gate electrode 13, and the gate insulation film 14 are formed on the substrate 12 by the same process as that for the conventional vertical transistor. Next, a first oxide semiconductor layer 15A formed of M1-M2-O to be part of the oxide semiconductor layer 15 is formed along a hollow portion H present on the inner side of the gate insulation film 14. The first oxide semiconductor layer 15A does not contain the A element and contributes to the formation of the second region R2 and the third region R3.

Next, as illustrated in FIG. 9B, a second oxide semiconductor layer 15B formed of M1-M2-O containing the A element is formed on the first oxide semiconductor layer 15A. The second oxide semiconductor layer 15B contains the A element within the predetermined range as previously described. Forming the oxide semiconductor layer 15 by stacking the first oxide semiconductor layer 15A and the second oxide semiconductor layer 15B as described above makes it possible to obtain the oxide semiconductor layer 15 in which the content of the A element varies, for example, in an inclining manner. For example, in the first region R1 facing the gate electrode 13, the second oxide semiconductor layer 15B mainly functions, making it possible to make the first region R1 to exhibit the aforesaid original characteristics of the oxide semiconductor layer 15. On the other hand, in the region R2 in contact with the source electrode 16 and the region R3 in contact with the drain electrode 16, at least part of the first oxide semiconductor layer 15A is present, making it possible to decrease the contact resistances with the source electrode 16 and the drain electrode 17.

Thereafter, as illustrated in FIG. 9C, the drain electrode 17 is formed after the insulator 18 is filled in the hollow portion H remaining on the inner side of the second oxide semiconductor layer 15B, resulting in the formation of the transistor 11. As the insulator 18 filled in the hollow portion H remaining on the inner side of the second oxide semiconductor layer 15B, a silicon oxide film or the like is typically used. The insulator 18 filled in the hollow portion H may be a silicon oxide film containing at least one A element selected from F and Cl, for instance. By using the silicon oxide film containing F and/or Cl as the insulator 18, F and/or Cl contained in the insulator 18 may be diffused to the second oxide semiconductor layer 15B. The same applies to the second manufacturing process.

Figure 10A:
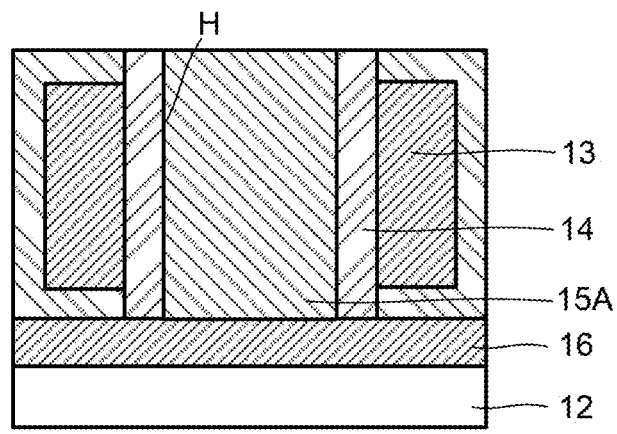
FIG. 10A to FIG. 10D are sectional views illustrating a second manufacturing process of the semiconductor device of the second embodiment.
Figure 10B:
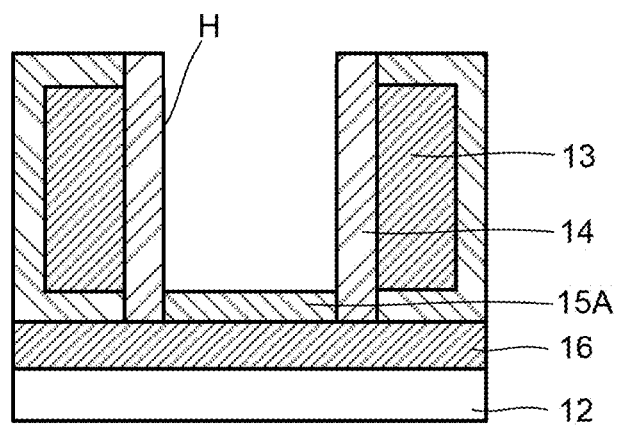

The second manufacturing process of the transistor 11 illustrated in FIG. 8 will be described with reference to FIG. 10A to FIG. 10D. The second manufacturing process is a manufacturing method that sets the region in which the content of the A element is less than 1 atomic %, in the second region R2 in contact with the source electrode 16. First, as illustrated in FIG. 10A, the source electrode 16, the gate electrode 13, and the gate insulation film 14 are formed on the substrate 12 as in the first manufacturing process. Next, a first oxide semiconductor layer 15A that is formed of M1-M2-O to be part of the oxide semiconductor layer 15 is filled in the hollow portion H present on the inner side of the gate insulation film 14. The first oxide semiconductor layer 15A does not contain the A element and contributes to the formation of the second region R2. Next, as illustrated in FIG. 10B, the first oxide semiconductor layer 15A is etched back. The thickness of a remaining part of the first oxide semiconductor layer 15A only needs to be large enough for the second region R2 in contact with the source electrode 16 to be formed therein and is not limited.

Figure 10C:
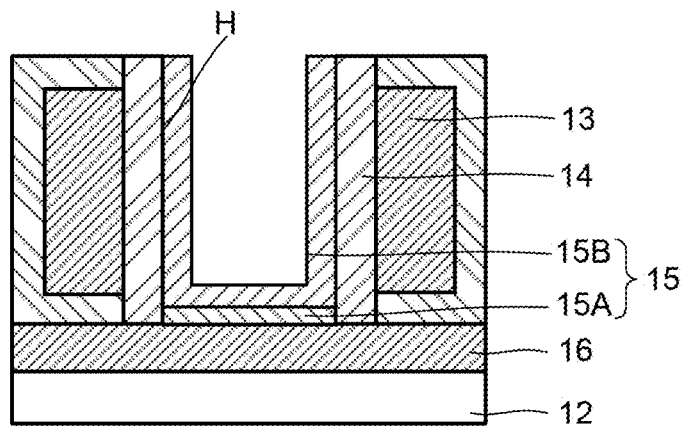

Next, as illustrated in FIG. 10C, a second oxide semiconductor layer 15B formed of M1-M2-O containing the A element is formed in the hollow portion H including the top of the first oxide semiconductor layer 15A. The second oxide semiconductor layer 15B contains the A element within the predetermined range as previously described. Forming the oxide semiconductor layer 15 by stacking the first oxide semiconductor layer 15A and the second oxide semiconductor layer 15B as described above makes it possible to form the first region R1 facing the gate electrode 13 by using the second oxide semiconductor layer 15B and form the second region R2 in contact with the source electrode 16 by using the first oxide semiconductor layer 15A. Therefore, it is possible to decrease the contact resistance with the source electrode 16 while making the first region R1 exhibit the characteristics of the oxide semiconductor layer 15.

Figure 10D:
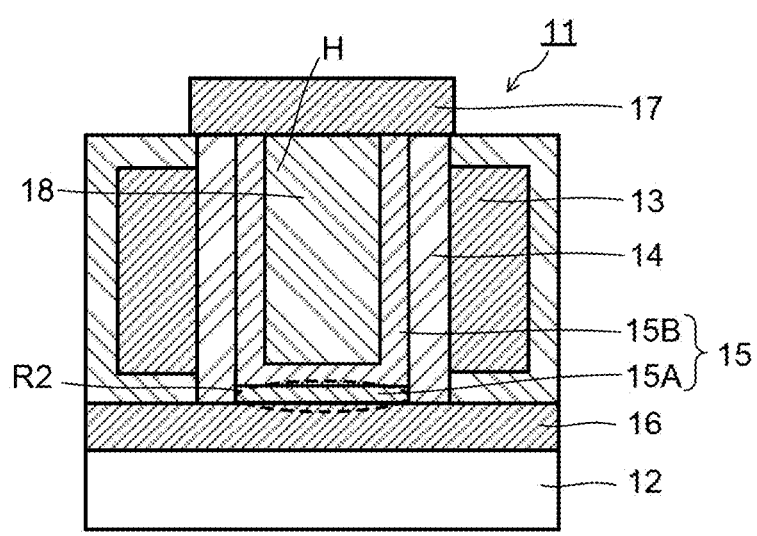

Thereafter, as illustrated in FIG. 10D, the drain electrode 17 is formed after the insulator 18 is filled in the hollow portion H remaining on the inner side of the second oxide semiconductor layer 15B, resulting in the formation of the transistor 11. The insulator 18 filled in the hollow portion H remaining on the inner side of the second oxide semiconductor layer 15B may be a silicon oxide film containing at least one A element selected from F and Cl as in the first manufacturing process. By using the silicon oxide film containing F and/or Cl as the insulator 18, F and/or Cl contained in the insulator 18 may be diffused to the second oxide semiconductor layer 15B.

Figure 11A:
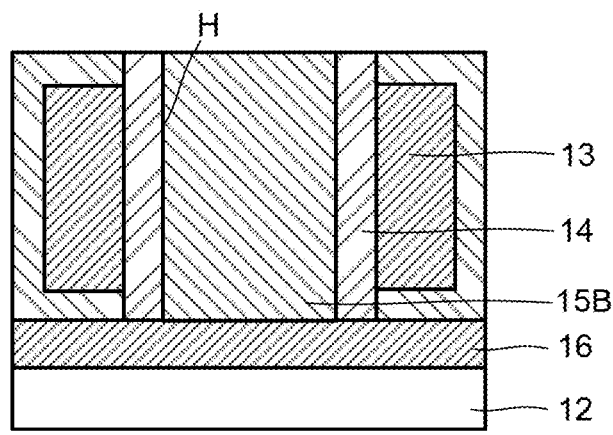
FIG. 11A to FIG. 11D are sectional views illustrating a third manufacturing process of the semiconductor device of the second embodiment.
Figure 11B:
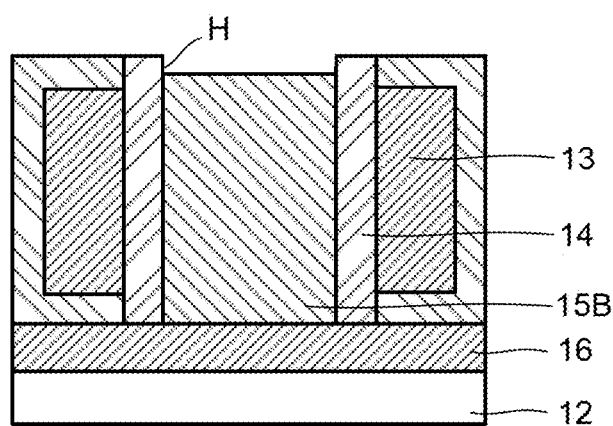

The third manufacturing process of the transistor 11 illustrated in FIG. 8 will be described with reference to FIG. 11A to FIG. 11D. The third manufacturing process is a manufacturing method that sets the region in which the content of the A element is less than 1 atomic %, in the third region R3 in contact with the drain electrode 17. First, as illustrated in FIG. 11A, the source electrode 16, the gate electrode 13, and the gate insulation film 14 are formed on the substrate 12 as in the first manufacturing process. Next, a second oxide semiconductor layer 15B formed of M1-M2-O containing the A element is filled in the hollow portion H present on the inner side of the gate insulation film 14. Next, as illustrated in FIG. 11B, the second oxide semiconductor layer 15B is etched back. The depth by which the second oxide semiconductor layer 15B is etched back only needs to be large enough for the third region R3 in contact with the drain electrode 17 to be formed therein and is not limited.

Figure 11C:
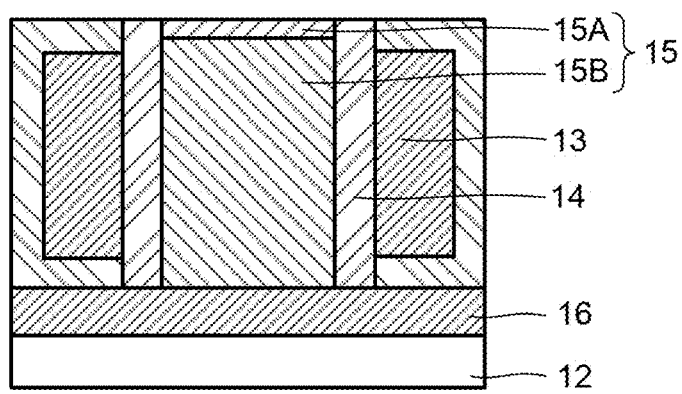

Next, as illustrated in FIG. 11C, in the hollow portion H formed after the second oxide semiconductor layer 15B is etched back, a first oxide semiconductor layer 15A formed of M1-M2-O not containing the A element is formed. Forming the oxide semiconductor layer 15 by stacking the first oxide semiconductor layer 15A and the second oxide semiconductor layer 15B as described above makes it possible to form the first region R1 adjacent to the gate electrode 13 by using the second oxide semiconductor layer 15B and form the third region R3 in contact with the drain electrode 17 by using the first oxide semiconductor layer 15A. Therefore, it is possible to decrease the contact resistance with the drain electrode 17 while making the first region R1 exhibit the characteristics of the oxide semiconductor layer 15. Thereafter, as illustrated in FIG. 11D, the drain electrode 17 is formed on the oxide semiconductor layer 15, resulting in the formation of the transistor 11.

Figure 12A:
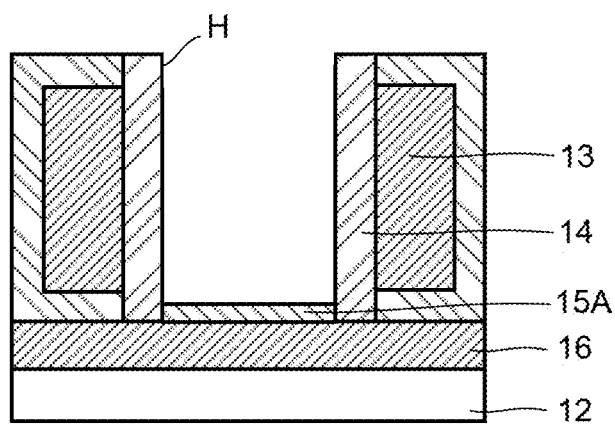
FIG. 12A to FIG. 12D are sectional views illustrating a fourth manufacturing process of the semiconductor device of the second embodiment.
Figure 12B:
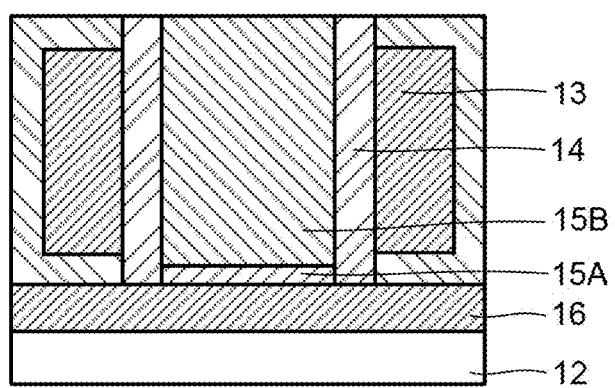

The fourth manufacturing process of the transistor 11 illustrated in FIG. 8 will be described with reference to FIG. 12A to FIG. 12D. The fourth manufacturing process is a combination of the second manufacturing process and the third manufacturing process. First, as in the process illustrated in FIG. 10B, a first oxide semiconductor layer 15A filled in the hollow portion H is etched back (FIG. 12A). Next, as illustrated in FIG. 12B, a second oxide semiconductor layer 15B formed of M1-M2-O containing the A element is filled in the hollow portion H including the top of the first oxide semiconductor layer 15A.

Figure 12C:
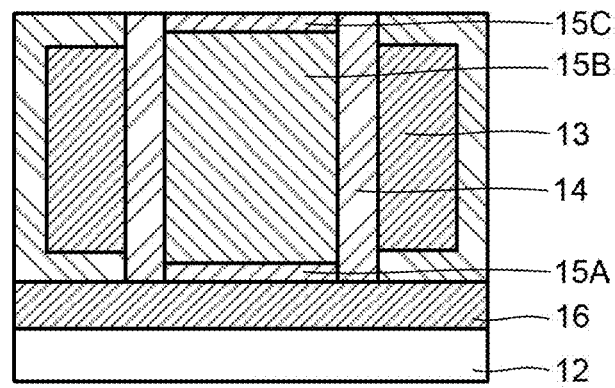

Next, as illustrated in FIG. 12C, the second oxide semiconductor layer 15B is etched back, and a third oxide semiconductor layer 15C formed of M1-M2-O not containing the A element is formed in the hollow portion H formed after the second oxide semiconductor layer 15B is etched back. Forming the oxide semiconductor layer 15 by stacking the first oxide semiconductor layer 15A, the second oxide semiconductor layer 15B, and the third oxide semiconductor layer 15C as described above makes it possible to form the first region R1 adjacent to the gate electrode 13 by using the second oxide semiconductor layer 15B and form the second region R2 in contact with the source electrode 16 and the third region R3 in contact with the drain electrode 17 by using the first and third oxide semiconductor layers 15A, 15C respectively. Therefore, it is possible to decrease the contact resistances with the source electrode 16 and the drain electrode 17 while making the first region R1 exhibit the characteristics of the oxide semiconductor layer 15. Thereafter, as illustrated in FIG. 12D, the drain electrode 17 is formed on the oxide semiconductor layer 15, resulting in the formation of the transistor 11.

Figure 11D:
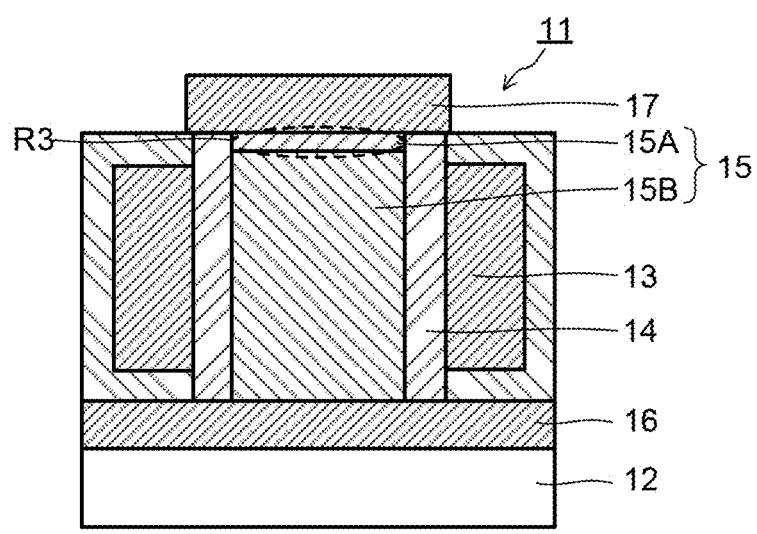
Figure 12D:
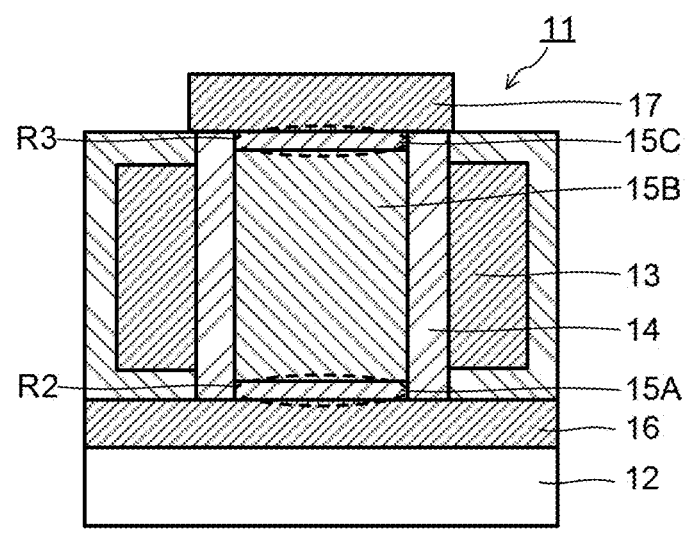

Though FIG. 11D and FIG. 12D illustrate the state in which the oxide semiconductor layer 15 is columnar, the oxide semiconductor layer 15 illustrated in FIG. 8 can be employed in the third and fourth manufacturing processes. Forming the oxide semiconductor layer 15 along the inner surface of the hollow portion H makes it possible to obtain the oxide semiconductor layer 15 having the shape illustrated in FIG. 8. In this case, the insulator 18 is filled in the hollow portion formed on the inner side of the oxide semiconductor layer 15.

Third Embodiment

Figure 13:
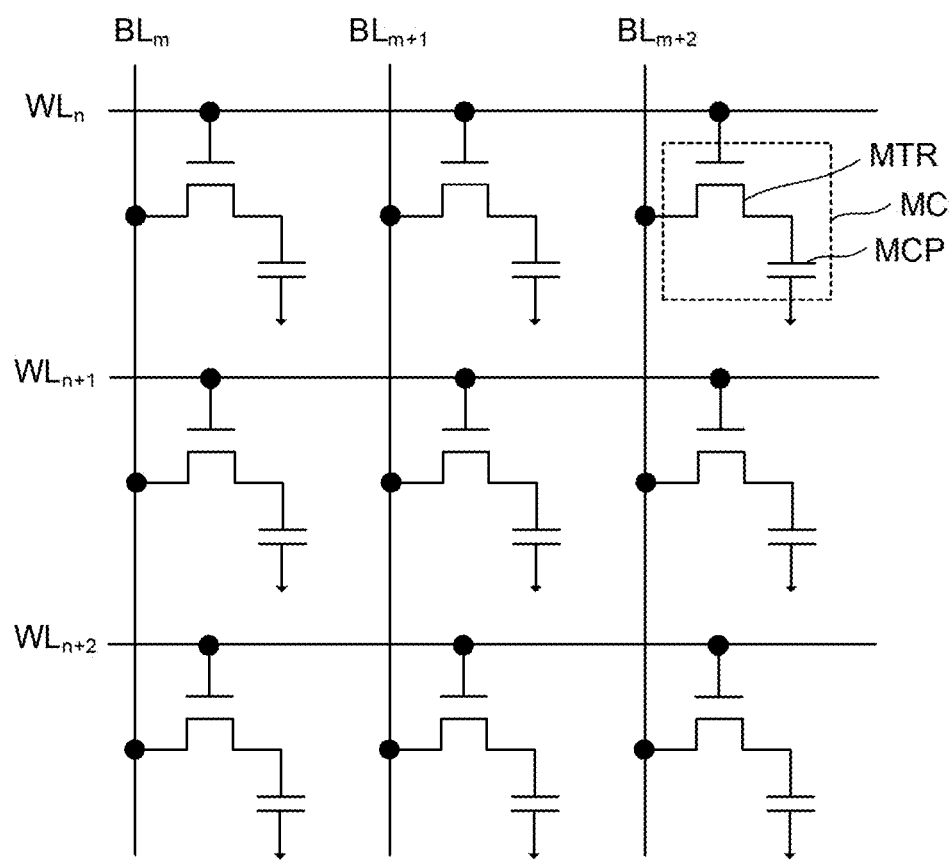
FIG. 13 is a circuit diagram of a semiconductor memory device of a third embodiment.
Figure 14:
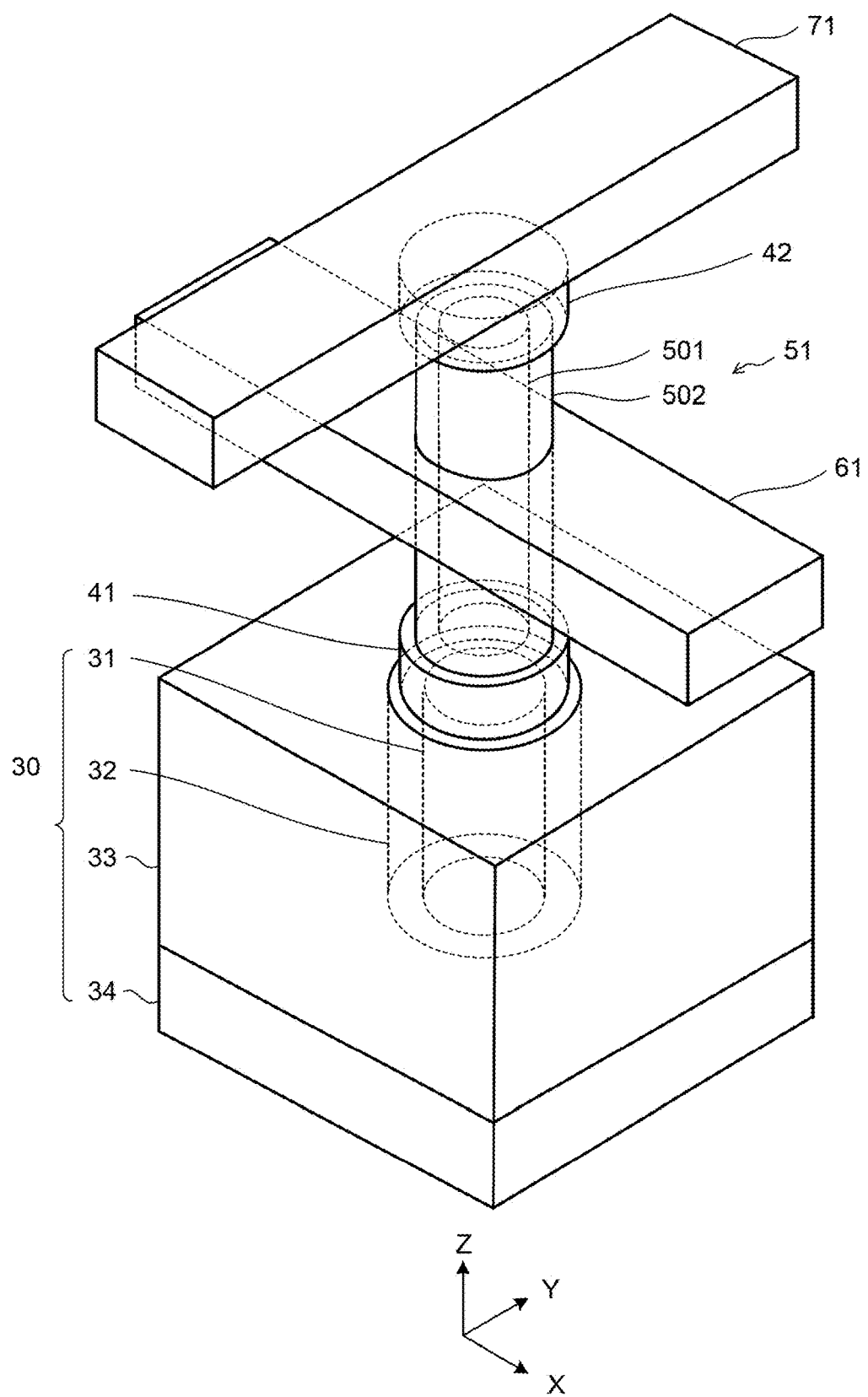
FIG. 14 is a schematic perspective view illustrating a memory cell of the semiconductor memory device of the third embodiment.
Figure 15:
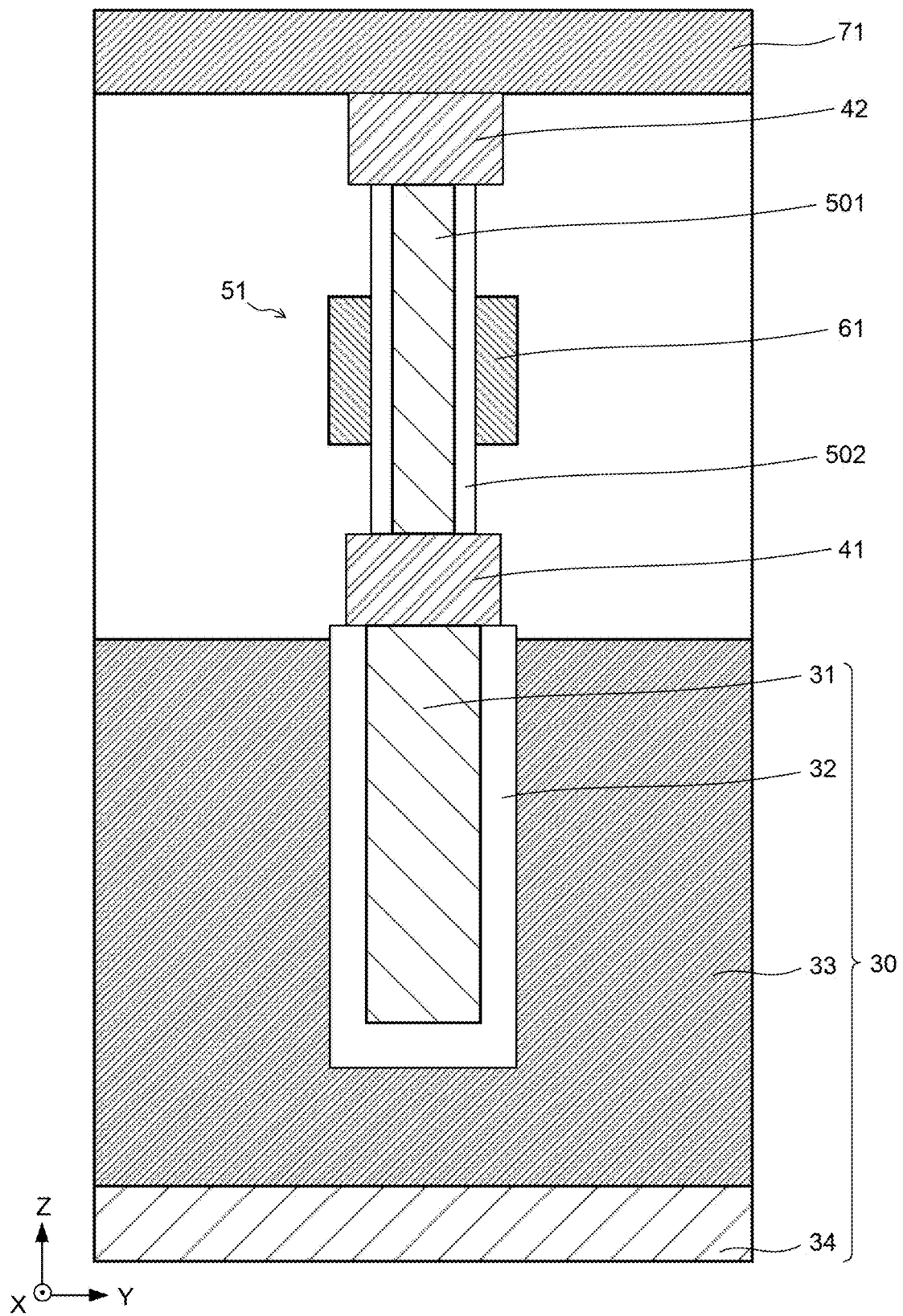
FIG. 15 is a schematic sectional view illustrating the memory cell of the semiconductor memory device of the third embodiment.

FIG. 13, FIG. 14, and FIG. 15 illustrate a semiconductor memory device of a third embodiment. The semiconductor memory device illustrated in these drawings has a plurality of memory cells. FIG. 13 is an explanatory circuit diagram illustrating a circuit configuration example of the memory cell array. FIG. 13 illustrates a plurality of memory cells MC, a plurality of word lines WL (a word line $WL_n$, a word line $WL_{n+1}$, and a word line $WL_{n+2}$, n is an integer), and a plurality of bit lines BL (a bit line $BL_m$, a bit line $BL_{m+1}$, and a bit line $BL_{m+2}$, m is an integer).

The plurality of memory cells MC are arranged in a matrix to form the memory cell array. The memory cells MC each include a memory transistor MTR that is a field-effect transistor (FET) and a memory capacitor MCP. The memory transistor MTR has a gate connected to the corresponding word line WL and has one of a source and a drain connected to the corresponding bit line BL. The memory capacitor MCP has one electrode connected to the other of the source and the drain of the memory transistor MTR and has the other electrode connected to a not-illustrated power supply line that supplies a predetermined potential. The memory cell MC can hold data by storing electric charges in the memory capacitor MCP from the bit line BL in response to the switching of the memory transistor MTR based on the word line WL. The number of the memory cells MC is not limited to the number in FIG. 13.

An example of the structures of the field-effect transistor MTR and the memory capacitor MCP in the memory cell MC will be described with reference to FIG. 14 and FIG. 15. In FIG. 14 and FIG. 15, reference sign 30 denotes the memory capacitor MCP, and reference sign 51 denotes the field-effect transistor (memory transistor) MTR. FIG. 14 is a schematic perspective view of the memory cell MC, and FIG. 15 is a schematic sectional view of the memory cell MC. The capacitor 30 is provided at a position that is above a semiconductor substrate and is under the field-effect transistor 51, to form the memory capacitor MCP of the memory cell MC.

The capacitor 30 is a three-dimensional capacitor such as what is called a pillar capacitor or a cylinder capacitor and, as illustrated in FIG. 14 and FIG. 15, it has a cell electrode 31, an insulation film 32, a plate electrode 33, and a plate electrode 34. The cell electrode 31 functions as a first electrode of the memory capacitor MCP. The insulation film 32 functions as a dielectric layer of the memory capacitor MCP and is between the cell electrode 31 and the plate electrode 33. The plate electrode 33 functions as a second electrode of the memory capacitor MCP and faces the cell electrode 31. The plate electrode 34 is connected to the plate electrode 33. The above-described three-dimensional capacitor 30 makes it possible to reduce the area of the memory cell MC.

An oxide conductive layer 41 is provided in contact with the cell electrode 31 as illustrated in FIG. 14 and FIG. 15. The oxide conductive layer 41 contains a metal oxide, for example, an indium-tin-oxide (ITO) or the like. The field-effect transistor 51 is provided at a position that is above the semiconductor substrate and above the capacitor 30 to form the memory transistor MTR of the memory cell MC.

As illustrated in FIG. 14 and FIG. 15, the field-effect transistor 51 has a channel layer 501 including an oxide semiconductor such as a metal oxide and a gate insulation film 502 surrounding the channel layer 501. One end of the channel layer 501 in terms of a z-axis direction is connected to a wiring line 71 through an oxide conductive layer 42 and functions as one of the source and the drain of the field-effect transistor 51, and the other end thereof is connected to the oxide conductive layer 41 and functions as the other of the source and the drain of the field-effect transistor 51. In this case, the oxide conductive layer 41 is between the cell electrode 31 of the capacitor 30 and the channel layer 501 of the field-effect transistor 51 to function as the other of the source electrode and the drain electrode of the field-effect transistor 51. Since the oxide conductive layer 41 contains a metal oxide similarly to the channel layer 501 of the field-effect transistor 51, it is possible to reduce the connection resistance between the field-effect transistor 51 and the oxide conductive layer 41.

The channel layer 501 has the same structure as that of the oxide semiconductor layers (5, 15) in the first and second embodiments described above. The gate insulation film 502 contains, for example, an oxide or an oxynitride (silicon oxide, for instance). A wiring line 61 is provided to face the channel layer 501 across the gate insulation film 502 as illustrated in FIG. 14 and FIG. 15 to function as a gate electrode of the field-effect transistor 51. The field-effect transistor 51 is what is called a surrounding gate transistor (SGT) in which the gate electrode surrounds the channel layer 501 as illustrated in FIG. 14. The use of SGT makes it possible to reduce the area of the semiconductor memory device.

A field-effect transistor having a channel layer including an oxide semiconductor is lower in off-leakage current than a field-effect transistor provided on a semiconductor substrate. Therefore, for example, it can retain data held in the memory cell MC long, making it possible to reduce the number of times of a refresh operation. Further, since the field-effect transistor having the channel layer including the oxide semiconductor can be formed by a low-temperature process, it is possible to reduce heat stress given to the capacitor 30.

The wiring line 61 contains, for example, a metal, a metal compound, or a semiconductor. The wiring line 61 contains at least one material selected from a group consisting of tungsten (W), titanium (Ti), titanium nitride (TiN), molybdenum (Mo), cobalt (Co), and ruthenium (Ru), for instance.

The oxide conductive layer 42 is in contact with the channel layer 501 of the field-effect transistor 51 as illustrated in FIG. 14 and FIG. 15 to function as one of the source electrode and the drain electrode of the field-effect transistor 51. The oxide conductive layer 42 includes a metal oxide, for example, an indium-tin-oxide (ITO) or the like. Since the oxide conductive layer 42 includes the metal oxide similarly to the channel layer 501 of the field-effect transistor 51, it is possible to reduce the connection resistance between the field-effect transistor 51 and the oxide conductive layer 42.

The wiring line 71 is provided above the field-effect transistor 51 so as to be in contact with the oxide conductive layer 42 and is connected to the channel layer 501 of the field-effect transistor 51 through the oxide conductive layer 42 as illustrated in FIG. 14 and FIG. 15. The oxide conductive layer 42 functions as one of the source electrode and the drain electrode of the field-effect transistor 51.

While certain embodiments of the present invention have been described above, these embodiments have been presented by way of example only, and are not intended to limit the scope of the invention. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   an oxide semiconductor layer extending in a first direction, and including a first end portion and a second end portion opposite the first end portion;
   a first electrode surrounding an outer peripheral surface of the oxide semiconductor layer;
   an insulation film between the first electrode and the outer peripheral surface of the oxide semiconductor layer;
   a second electrode electrically connected to the first end portion of the oxide semiconductor layer; and
   a third electrode electrically connected to the second end portion of the oxide semiconductor layer, wherein
   the oxide semiconductor layer comprises a metal oxide containing at least one first element selected from the group consisting of indium and tin and at least one second element selected from the group consisting of zinc, gallium, aluminum, tungsten, and silicon, and
   the oxide semiconductor layer includes a first region in which at least one third element selected from the group consisting of fluorine and chlorine is contained within a range of 1 atomic % or more and less than 8 atomic % in the metal oxide;
   an insulator which extends in the first direction, and is surrounded by the oxide semiconductor layer, wherein
   the insulator contains at least one element selected from the group consisting of fluorine and chlorine.

2. The semiconductor device according to claim 1, wherein the oxide semiconductor layer has an amorphous structure.

3. The semiconductor device according to claim 1, wherein the oxide semiconductor layer includes a second region in which the third element is contained within a range of less than 1 atomic % in the metal oxide.

4. The semiconductor device according to claim 1,
   wherein, when a composition of the first region is represented by
   a composition formula: $M^2_i M^3_j M^4_k M^6_l (O, F, Cl)_n$,
   where $M^2$ represents Zn, $M^3$ represents at least one of In, Ga, or Al, $M^4$ represents at least one of Sn or Si, $M^6$ represents W, i represents an atomic ratio of $M^2$, j represents an atomic ratio of $M^3$, k represents an atomic ratio of $M^4$, l represents an atomic ratio of $M^6$, and n represents a total atomic ratio of O, F, and Cl, the composition of the first region satisfies a relation of $$(2i+3j+4k+6l)/2\times 0.95 < n < (2i+3j+4k+6l)/2\times 1.05.$$

5. The semiconductor device according to claim 1, wherein the oxide semiconductor layer includes the first region facing the first electrode across the insulation film and at least one of a second region which is electrically connected to the second electrode and in which a content of the third element is less than 1 atomic % in the metal oxide and a third region which is electrically connected to the third electrode and in which a content of the third element is less than 1 atomic % in the metal oxide.

6. The semiconductor device according to claim 1, further comprising a capacitor electrically connected to the second electrode or the third electrode.

\* \* \* \* \*